United States Patent

[11] 3,575,644

[72] Inventors Gerald C. Huth
Malvern, Pa.;
Robert L. Davies, Auburn, N.Y.

[21] Appl. No. 812,492
[22] Filed Oct. 31, 1968
Division of Ser. No. 255,037, Jan. 30, 1963, Pat. No. 3,491,272, Jan. 20, 1970
[45] Patented Apr. 20, 1971
[73] Assignee General Electric Company

[54] SEMICONDUCTOR DEVICE WITH DOUBLE POSITIVE BEVEL
2 Claims, 7 Drawing Figs.

[52] U.S. Cl. .......... 317/234R, 317/235T, 317/235W, 317/235AJ
[51] Int. Cl. .......... H01l 9/00, H01l 9/12
[50] Field of Search .......... 317/235, 40, 10, 47, 46, 47.1

[56] References Cited
UNITED STATES PATENTS

| | | | |
|---|---|---|---|
| 2,600,500 | 6/1952 | Haynes et al. | 317/235 |
| 2,954,307 | 9/1960 | Shockley | 317/235 |
| 3,007,090 | 10/1961 | Rutz | 317/235 |
| 3,179,860 | 4/1965 | Clark et al. | 317/235 |

*Primary Examiner*—Jerry D. Craig
*Attorneys*—Nathan J. Cornfeld, Carl O. Thomas, Frank L. Neuhauser, Oscar B. Waddell, Robert J. Mooney and Melvin M. Goldenberg

ABSTRACT: To improve the reverse voltage breakdown characteristics of a semiconductor body having a junction therein formed by zones of dissimilar resistivities the periphery of the body adjacent the junction is beveled. With a positive bevel (lowest cross section zone having the highest resistivity) the reverse voltage breakdown characteristics improve progressively as the angle between the junction and the beveled periphery decreases. With two junction bodies having a higher resistivity N or P central zone between P or N zones, respectively, of lower resistivity a positive bevel may be provided at each junction so that a pulleylike concave periphery results with the minimum cross section of the body appearing in the central zone.

INVENTORS:
ROBERT L. DAVIES,
GERALD C. HUTH,
BY Carl O. Thomas
THEIR ATTORNEY.

INVENTORS:
ROBERT L. DAVIES,
GERALD C. HUTH,

BY Carl O. Thomas
THEIR ATTORNEY.

SEMICONDUCTOR DEVICE WITH DOUBLE POSITIVE BEVEL

This is a division of our application Ser. No. 255,037, filed Jan. 30, 1963, now U.S. Pat. No. 3,491,272, issued Jan. 20, 1970.

This invention relates to a means for improving the characteristics of semiconductor materials which have at least one internal junction between two zones of different conduction characteristics and the characteristics of devices which utilize such materials. More specifically, the invention is directed toward means for increasing the reverse or inverse voltage which may be applied to such devices without a breakdown and to increase the ability of such devices to dissipate power when the device does break down in the reverse direction. Reverse voltage as used here is a voltage which is of a polarity that would normally cause conduction to take place across a given junction in the direction of high impedance.

A junction between zones of a semiconductor material having opposite type conduction characteristics provides a low resistance path to an electric current flowing across the junction in one direction, and a high resistance path to current flow in the opposite direction. A voltage which is of such a polarity as to force a current across the junction in the direction of higher resistance is the inverse voltage referred to above. When an inverse voltage is applied across the junction between zones of semiconductor material having an excess of free electrons (N-type conduction characteristics) and an excess of positive holes (P or positive conduction characteristics) respectively, the region surrounding the junction becomes deficient of free electrons and positive holes (known as carriers). The reason that this happens is that when a positive voltage is applied at the negative type conduction zone and a negative voltage applied at the positive type conduction zone, the positive carriers are attracted to the negative voltage terminal and the negative carriers are attracted to the positive voltage terminal. Thus, the carriers on both sides of the junction are attracted away from the junction to form a region (called the depletion region). The depletion region is a dielectric because of the deficiency of carriers of either type.

The dielectric depletion region is highly resistive and is capable of withholding high voltages. For example, in most practical devices, the dielectric depletion region is capable of withstanding a reverse voltage of several hundred volts without breaking down through the bulk of the material. However, most devices are not capable of withstanding more than a relatively small fraction of the voltage which the bulk will hold in the reverse direction (either transient or steady state) due to the fact that breakdown first occurs across or around the surface. For this reason, it is said that most such devices are surface limited.

The fact that most rectifiers are surface limited places severe limitations on the usefulness of the devices. To begin with, it means that the device cannot be used in circuits where reverse voltages (either steady state or transient) of over a few hundred volts are likely to occur without taking special precautions (frequently elaborate) to prevent application of the reverse voltage directly across the device.

As serious as this drawback appears, it is perhaps not as serious as other disadvantages which occur because such devices are surface limited; viz, device instability, and destruction of the device upon surface breakdown in the reverse direction.

Device instability is most frequently due to the fact that the condition of the semiconductor surface changes. The characteristics of such devices vary considerably with the condition of the surface. Therefore, unless some precautions are taken to assure that the surface condition will not change appreciably during the use of the device, the device stability is very poor. Actually it is much more difficult to control condition of the surface of the material than it is to control the characteristics of the bulk and it is certainly more difficult to control or prevent changes in surface condition than to control the essentially constant bulk characteristics. The fact of the matter is that even with elaborate precautions such as utilizing various kinds of surface treatment and placing the semiconductor material in an evacuated hermetically sealed container, the predominant failure mechanism of rectifier devices during operation is a result of surface degradation.

As to the point concerning device destruction, it is a well recognized fact that typical rectifiers (which are surface limited devices) may be permanently damaged or destroyed by only a few watts of power absorbed during breakdown, as from a very brief voltage transient, in the reverse or blocking direction. The fact that the bulk material can dissipate a great deal of energy is readily apparent by taking as an example a typical silicon rectifier and considering that such devices can, at least momentarily, dissipate 1,000 watts of heat in the forward direction of current flow without any damage whatsoever. This apparent anamoly can be explained by considering the fact that for conduction in the forward direction, current and its attendant heat losses spread out equally over the entire junction area, permitting maximum utilization of the entire rectifier cooling mechanism and its thermal capacity. However, in the reverse direction, the rectifier surface current under momentary high blocking voltage peaks finds some microscopic flaw or weakness at which to concentrate. Such weak spots usually occur at the junction surface where the rectifying junction emerges from the silicon pellet. At these minute spots, a fraction of a watt of concentrated heat may be sufficient to melt and destroy the blocking properties of the rectifier, regardless of size of the rectifier. The inverse voltage problem is so critical that transient rating in the reverse direction is done on the basis of voltage rather than energy.

When failure due to reverse voltage applied to the rectifier takes place through the bulk of the material instead of over the surface, the device can dissipate approximately as much energy, both steady state and transient, in its reverse direction as in its forward direction. When the device breaks down through the bulk and current flows in the reverse direction, the breakdown is called "avalanche breakdown" (sometimes mistakenly called "Zener breakdown"). Avalanche breakdown of a silicon rectifier diode is an inherent nondestructive characteristic that is widely used at relatively low power and voltage levels as a constant voltage reference and regulator in so called "Zener" diodes. Like a Zener diode, a rectifier operated within its thermal limitations maintains substantially constant voltage across it in the avalanche region regardless of current in this region. As long as the current is limited by the external circuit to the thermal capability of the device, no damage results from true avalanche action. Hence, a device with uniform avalanche breakdown occurring at a voltage below that at which local dielectric surface breakdowns occur, can dissipate hundreds of times more reverse energy with transient overvoltage conditions than one where the converse is true.

Perhpas it is well to point out that breakdown is likely to occur at the surface of the semiconductor material because of the high voltage gradient at the surface of the device. Stated in another way, breakdown occurs at the surface due to high concentration of electric fields at the surface. As a practical matter, the place where the electric field is usually of the highest intensity is in the vicinity of the junction between the two zones of opposite conduction type characteristics. For example, the transition region or junction between the two different conduction zones may be on the order of $10^{13}$ centimeters in thickness. Thus, it is readily seen that a very strong electric field (high electric field intensity) occurs at a surface area of the body intercepted by the junction.

With these facts in mind, the objects of the present invention can be fully appreciated. For example, it is an object of the present invention to provide a semiconductor device wherein breakdown due to reverse voltage occurs within the bulk of the material of the semiconductor material instead of at the surface. Another object of the invention is to provide a semiconductor device capable of wide application without the necessity of providing protective devices which prevent high reverse voltages. Still another object of the invention is to provide a semiconductor device with surface stability problems largely eliminated.

In carrying out the present invention, semiconductor material and the device in which it is used is made bulk limited rather than surface limited by effectively distributing the electric fields over the surface to lower the maximum value (i.e., the peak electric field is reduced) or the surface voltage gradient is reduced in the area of a junction by carefully controlling the shape of the surface in the region of the junction.

The novel features which are believed to be characteristic of the invention are set forth with particularity in the appended claims. The invention itself, however, both as to its organization and method of operation together with further objects and advantages thereof may best be understood by reference to the following description taken in connection with the accompanying drawings in which:

Figure 1:
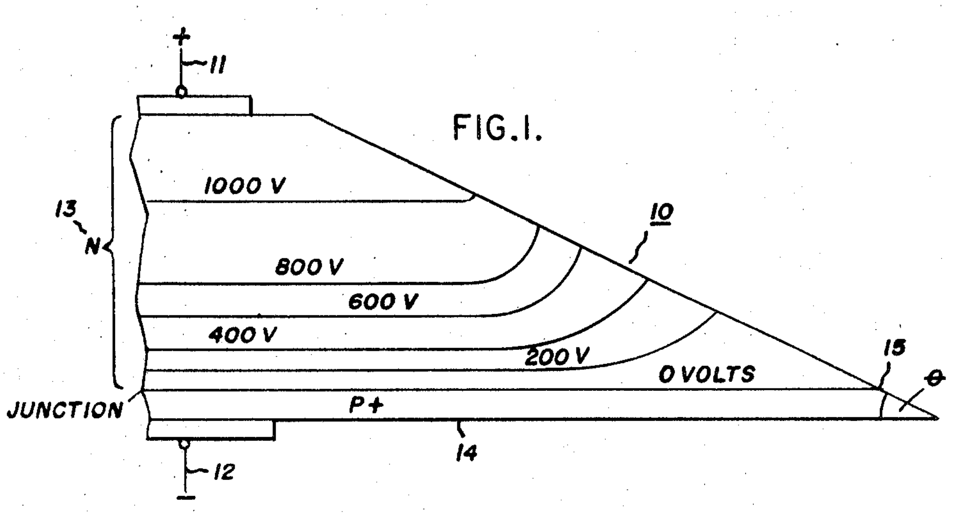
FIG. 1 is a central vertical section through a segment of semiconductor pellet which utilizes teachings of the present invention and which is used to define terms and concepts of the present invention.
Figure 4:
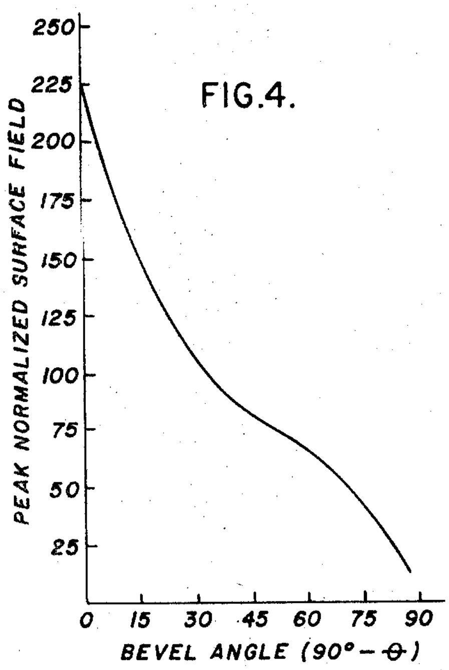
Figure 5:
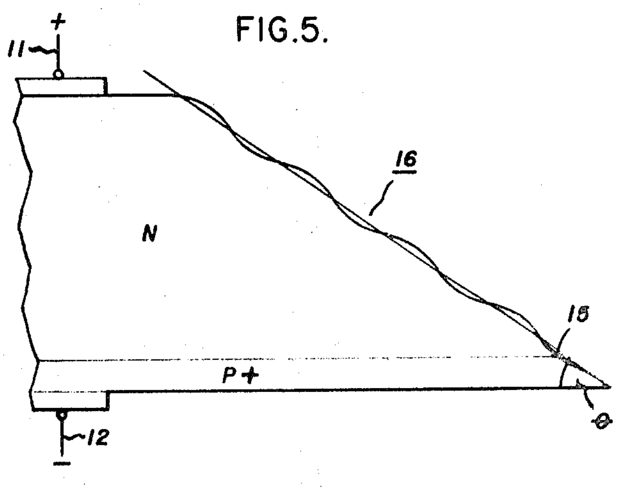
Figure 6:
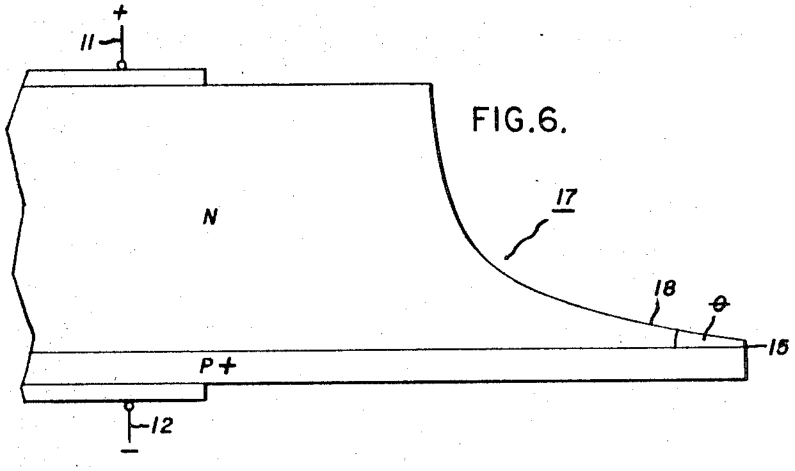
Figure 7:
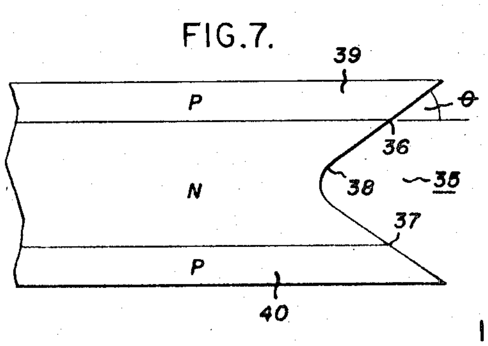

(where $X$ is the distance measured from the PN junction of the device to a point on the surface in FIG. 1 and $W$ is the width of the depletion region;

FIG. 4 is a curve illustrating the peak normalized surface field plotted along the axis of ordinates versus the beveled angle (90°–Θ) plotted along the axis of abscissas for the device of FIG. 1;

FIGS. 5 and 6 are central vertical sections through semiconductor pellets which utilize techniques of the present invention and which are used to define terms and concepts; and FIG. 7 is a vertical section through a three layer PNP pellet illustrating the optimum contour for such a device.

In FIG. 1, the cross section of a segment of a pellet 10 of single crystal semiconductive material such as silicon or germanium is depicted in a somewhat diagrammatic fashion. The pellet for many practical semiconductor devices will be circular so that it has the general shape of a round coin but it may have any other shape. In order to have a practical device it is necessary to provide low resistance electrical contacts 11 and 12 (ohmic contacts) on the two major faces of pellet 10. The pellet 10 has two internal regions of different conductivity types; viz. an upper region 13 of N-type conductivity adjacent to the upper major face and a region 14 of P-type conductivity adjacent to the lower major face. The boundary of juncture between the two regions or zones 13 and 14 defines a PN junction 15. The lower P-type zone 14 is marked P+ to indicate that it is very highly doped (has a large number of P-type carriers) and therefore is more conductive (has a lower resistivity) than the upper N-type region 13.

In order to establish the exact conductivities for later discussion it will be noted that the pellet 10 shown was a monocrystalline silicon pellet of N-type and having a resistivity of 18 ohm centimeters. The P-type layer was formed by diffusing gallium into the pellet to place the junction depth ($X_j$) at about 3 mils.

The pellet 10 is made bulk limited rather than surface limited (i.e. peak reverse voltage is limited by the voltage at which avalanche breakdown occurs in the interior of the semiconductor pellet body rather than being limited by the peak surface electric field) by reducing the peak surface electric field in the region of the junction 15 under conditions of reverse bias. Reverse bias occurs when a voltage is applied across the contacts 11 and 12 which is of a polarity which tends to force current across the junction in the high impedance direction; e.g. positive at the upper contact 11 on the N-type zone relative to the lower contact 12 on the P-type zone. (Note that some small reverse current usually flows across the junction before breakdown but it is so much less than the current which flows in the forward direction it may, for our purposes, be ignored.) The maximum electric field which exists along the peripheral surface of the pellet 10 is reduced below that in the bulk of the material by properly contouring the peripheral surface of the pellet 10.

The contour used to reduce the peak surface electric field on the pellet 10 is a simple bevel which reduces the cross-sectional area of pellet 10 going from the heavily doped side of the PN junction 15 (P+ zone 14) to the lightly doped side (N-type zone 13). Or stated in another way, the side of highest resistivity has the smallest cross-sectional area when considering the cross sections taken parallel to the junction 15 (or major faces). This type of bevel is defined as a positive bevel as opposed to a negative bevel which is exactly opposite. Another way to consider the reduction is to consider that the reduction in size of the pellet is parallel to the planes of the junction 15 and major faces or perpendicular to the direction of the main charge carrier flow (which in turn is perpendicular to the junction 15). At the pellet edge, the carrier flow is not truly perpendicular to the junction but the main flow is. The angle Θ of the bevel for pellet 10 is 6° as measured by the acute angle the bevel makes with the planes of the junction 15 and the major faces of the pellet.

The plot of voltage lines (labeled 0, 200v, 400v. etc.) show how the electric field (voltage gradient) is spread along the beveled surface and that the voltage gradient is lower, i.e., or spread out, at the beveled surface than in the bulk of the material. That is, the voltage per unit of distance along the bevel is much less than the voltage per unit of distance through the bulk of the material perpendicular to the electrode bearing surfaces. The general result of lowering the surface field is to cause the sharp avalanche breakdown in the bulk of the material and enhance the capability of the junction to absorb power without destruction.

Perhaps the effect of the surface contour on spreading of the electric field is best understood by returning to a consideration of the depletion region which forms at the junction 15 in the presence of the reverse voltage. As indicated previously, a number of impurity atoms on opposite sides of the junction are stripped of their compensating charges (charge carriers) in the presence of an electric field. The charges are stripped in such a manner that a charge balance is left in a region of uncompensated impurity atoms. The region of uncompensated impurity atoms straddles the junction and is called the depletion region (of width W). This depletion region forms a dielectric.

By beveling the edge of the pellet 10 in the area of the PN junction 15, impurity atoms are removed which would normally be within the region of charge balance under the application of reverse bias. When the reverse bias is applied without the presence of these impurity atoms, impurity atoms further away from the PN junction 15 and in a direction along the surface contour must become a part of the region of charge balance. The total sum of charge on both sides of the junction 15, and contained within the depletion region, must be zero at equilibrium. Considering this resulting charge distribution, it is seen that the voltage lines must bend up (as shown) to meet the surface contour.

Figures 2, 3:
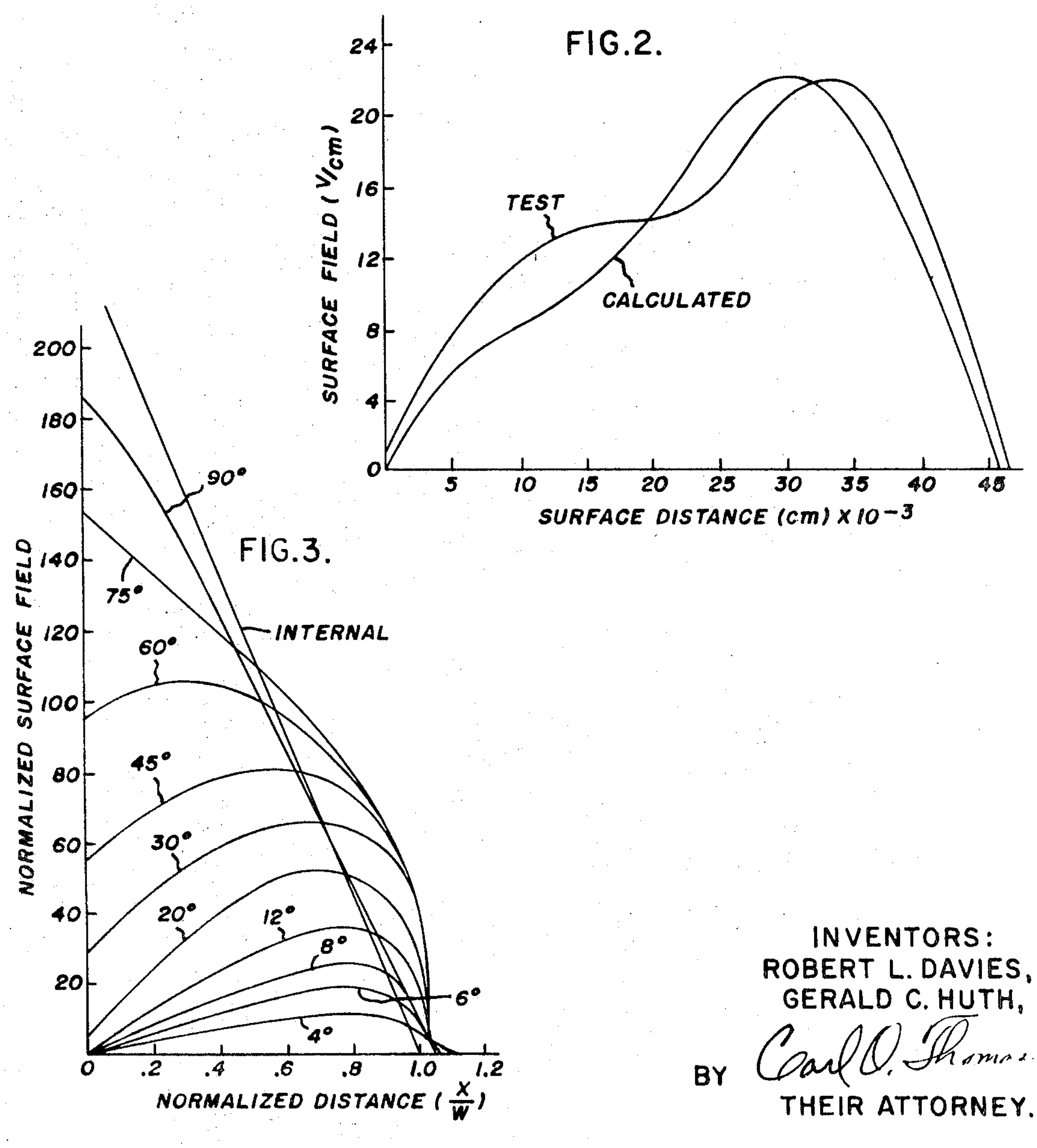
FIG. 2 is a plot showing a calculated curve and a test curve of surface field in volts per centimeter plotted on the axis of ordinates and distance measured along the bevel surface from the PN junction plotted on the axis of abscissas for the device in FIG. 1.
FIG. 3 shows curves taken for different positive bevel angles (as in FIG. 1) which illustrate the normalized surface field plotted along the axis of ordinates versus the normalized distance $$\left(\frac{X}{W}\right)$$

A better appreciation of the effect of the 6° surface bevel on the surface fields of the pellet 10 of FIG. 1 may be had by referring to FIG. 2 where plots of calculated and probed data for the surface field (in volts per centimeter) are plotted along the axis of ordinates against distance along the surface contour from the junction 15 plotted along the axis of abscissas. Considering that the peak electric field for a PN junction with no surface contour occurs at the junction 15 and that the peak field of pellet 10 occurs at a considerable distance (between $30\times10^{13}$ centimeters and $35\times10^{13}$ centimeters) toward the top contact 11 away from the junction 15, the effectiveness of the bevel can be seen. The electric field region is spread a greater distance along the surface contour from the junction 15 than in the bulk of the material and the peak electric field at the surface is considerably lower than that in the bulk.

As a matter of interest, the experimental and calculated curves agree very well. The experimental data was obtained by probing the surface of the pellet with a 3 mil tungsten probe and recording the voltage between one of the device contacts and the probe.

Actually, the 6° positive bevel used on pellet 10 is not optimum even if considerations are confined to an essentially straight bevel. This can be readily ascertained by reference to the curves of FIGS. 3 and 4 which apply to positively beveled junctions. In FIG. 3 the effect of different bevel angles Θ on the surface electric field is shown by plotting the normalized surface field N.S.F. along the axis of ordinates and the normalized distance $$\left(\frac{X}{W}\right)$$

along the axis of abscissas. The normalized surface field N.S.F. is obtained from the following equation:

$$N.S.F.=\frac{E_t}{2.4\times10^{-6}\sqrt{(Nd-Na)Va}}$$

where $(Nd-Na)$ is the net impurity concentration, $E_t$ is the actual surface field in volts per centimeter and $Va$ is the applied reverse bias voltage. $X$ is the distance from the junction as in FIG. 2 and $W$ is the width of the depletion region. From this graph (FIG. 3) it is seen that the smaller the bevel angle Θ the lower the peak surface electric field and as Θ becomes smaller the peak surface field moves away from the junction 15 toward the upper contact 11. Also, the barrier (depletion region) at the junction surface continues to spread.

Possibly the effect of the bevel angle on surface electric field is better shown by the graph of FIG. 4 where again the same normalized surface field is plotted along the axis of ordinates and a measure (90°–Θ) of the bevel angle is plotted along the axis of abscissas. From this curve it is seen that the peak field intensity decreases as Θ decreases. The peak field is considerably reduced for bevel angles Θ as large as 45°. However, for many devices the field at this value of Θ is still too high for good breakdown characteristics.

Using present surface treatment practices for a silicon pellet such as pellet 10, the peak surface electric field associated with the junction of the pellet of FIG. 1 (see FIG. 2) provides a very stable device. A successful device can be obtained using two or three times this peak field. A critical field value that can be used as a rule of thumb with normal surface treatments is 125,000 to 150,000 volts per centimeter. If the pellet surfaces are carefully cleaned and maintained by protective coatings, even these values can be exceeded.

The positive beveled contour on the periphery of pellet 10 is only one of many possible contours. The straight bevel shown is a very practical contour since it is effective and can be much more readily obtained by simple cutting and lapping techniques than very complex contours. The bevel is also a reasonably good approximation to some of the more complex contours and the data given here is useful for many contours.

FIG. 5 shows a pellet 16 with a contour which can be called a bevel. The bevel angle Θ for the contour is the average angle. As illustrated, the contour undulates about the bevel angle in a near sinusoidal fashion although the undulations in a practical device might be quite irregular depending mostly upon the method of contouring the surface. This pellet 16 has a junction between P-and N-type zones as well as electrical contacts which correspond to like parts of the pellet 10 of FIG. 1, therefore, corresponding parts are given corresponding reference characters.

Another type of positive contour is illustrated in FIG. 6. Again, parts of the device which correspond to like parts in FIG. 1 are given the same reference numerals. The contour on pellet 17 is generally referred to as a "mesa." This contour is most easily formed by conventional and well-known etching techniques. In any case, for best results the relatively flat land 18 of the mesa contour should be placed within the depletion region on the same side of the junction 15 as the mesa.

A number of practical devices require the use of multijunction (as distinguished from one junction and/or one junction and additional junctures which are not junctions) pellets. For example, FIG. 7 illustrates a common pellet type employing the inventive concept. The pellet 35 has two essentially planar rectifying junctions 36 and 37 (upper 36 and lower 37 respectively) defined by a central separating region 38 of one conductivity type (N-type shown) surrounded by upper and lower zones or regions 39 and 40 respectively of opposite conductivity type (P-type illustrated). The present discussion applies equally well where the conductivity type of all zones are reversed to give a NPN structure but in general, the central zone 38 will be of higher resistivity than either of the outer zones 39 or 40.

For a three layer two junction device the philosophy still entails employing a contour which reduces the electric field at the surface below that at which the device avalanches through the bulk and the best contour is one which most evenly distributes the electric field at the surface. A desirable contour is arrived at by considering each junction separately and utilizing the teachings given above.

The central region 38 is common to the depletion region of both junctions 36 and 37 and is of higher resistivity than either of the outer regions 39 or 40. Therefore, a near optimum contour can be obtained by applying a positive contour to each of the junctions 36 and 37. This results in a pellet 35 which looks very much like an ordinary pulley if we assume a round pellet. In other words, the double bevel is applied so that the cross-sectional area of the pellet is smaller in the central region 38 than at either of the outer zones. The angle Θ at which the bevels cross the planes of junctions 36 and 37 may be as small as practical or possible since the bevels are positive, but 6° is very satisfactory. This type of bevel is obtained by known selective etching techniques.

While particular embodiments of the invention have been shown and described, it will, of course, be understood that the invention is not limited thereto since many modifications varied to fit particular operating requirements and environments will be apparent to those skilled in the art. The invention may be used to perform similar functions and its peculiar properties taken advantage of in semiconductor devices utilizing other materials than those described and such devices formed in other ways without departing from the concept of the invention. Accordingly, the invention is not considered limited to the example chosen for the purposes of disclosure. It is considered that the manner of housing the semiconductor elements formed according to our invention will be obvious to those having ordinary skill in the art. Suitable exemplary device housings are set forth in our U.S. Pat. No. 3,491,272.

We claim:

1. A semiconductor device including a monocrystalline semiconductor body having two zones of like conduction characteristics separated by and contiguous with opposite sides of a zone having different conduction characteristics and a higher resistivity than either of said two zones defining two substantially planar parallel junctions between said zones, said body having its periphery contoured in such a manner that its cross-sectional area in a direction parallel to the plane of said junctions diminishes from each of said zones of like conduction characteristics across said junctions to said higher resistivity zone, that portion of said periphery lying adjacent said higher resistivity zone curving smoothly concavely inwardly in a pulley configuration to establish a minimum cross-sectional area between said junctions.

2. A semiconductor device according to claim 1 in which said periphery forms an approximately 6° positive bevel angle with at least one of said junctions.